United States Patent [19]
Takahashi

[11] Patent Number: 5,610,683
[45] Date of Patent: Mar. 11, 1997

[54] IMMERSION TYPE PROJECTION EXPOSURE APPARATUS

[75] Inventor: Kazuo Takahashi, Utsunomiya, Japan

[73] Assignee: Canon Kabushiki Kaisha, Tokyo, Japan

[21] Appl. No.: 464,062

[22] Filed: Jun. 5, 1995

Related U.S. Application Data

[63] Continuation of Ser. No. 156,707, Nov. 24, 1993, abandoned.

[30] Foreign Application Priority Data

Nov. 27, 1992 [JP] Japan ..................... 4-339510

[51] Int. Cl.$^6$ ......................................... G03B 27/42
[52] U.S. Cl. ................................................ 355/53
[58] Field of Search ........................ 355/30, 53, 125, 355/75

[56] References Cited

U.S. PATENT DOCUMENTS

| | | | |
|---|---|---|---|
| 4,131,363 | 12/1978 | Shea et al. | 355/75 |
| 4,480,910 | 11/1984 | Takanashi et al. | 355/30 |
| 4,509,852 | 4/1985 | Tabarelli et al. | 355/30 |
| 4,634,270 | 1/1987 | Yokoo et al. | 355/53 X |
| 4,676,631 | 6/1987 | Kosugi et al. | 355/53 X |
| 4,720,732 | 1/1988 | Tsutsui | 355/53 X |
| 4,742,376 | 5/1988 | Phillips | 355/53 X |
| 5,121,256 | 6/1992 | Corle et al. | 359/664 |

FOREIGN PATENT DOCUMENTS

| | | |
|---|---|---|
| 0023231 | 4/1981 | European Pat. Off. . |
| 0169485 | 1/1986 | European Pat. Off. . |

OTHER PUBLICATIONS

D. W. Pohl, et al., "Optical Stethoscopy: Image Recording with Resolution λ/20", Applied Physics Letters, vol. 44, No. 7, pp. 651–653 (Apr. 1, 1984).

H. Kawata, et al., "Optical Projection Lithography Using Lenses with Numerical Apertures Greater Than Unity", Microelectronic Engineering, International Conference on Microlithography, vol. 9, No. 1–4, pp. 31–36 (May, 1988).

*Primary Examiner*—Fred L. Braun
*Attorney, Agent, or Firm*—Fitzpatrick, Cella, Harper & Scinto

[57] ABSTRACT

A projection exposure apparatus includes an illuminating device for illuminating a pattern of an original, a holder for holding a substrate, and a projection system for projecting an image of the pattern of the original onto the substrate. The projection system includes a projection optical system and a plane optical element spaced from the projection optical system and disposed opposite to the surface of the substrate. Also provided is a casing having a filled interspace formed between the optical element and the substrate, with the optical element providing an upper cover of the casing.

29 Claims, 6 Drawing Sheets

IMMERSION TYPE PROJECTION EXPOSURE APPARATUS

This application is a continuation, of application Ser. No. 08/156,707, filed Nov. 24, 1993, now abandoned.

FIELD OF THE INVENTION AND RELATED ART

This invention relates to a semiconductor device manufacturing apparatus and, more particularly, to an immersion type projection exposure apparatus for lithographically printing a fine circuit pattern on a substrate, such as a wafer, during semiconductor manufacturing processes.

With miniaturization of each semiconductor device, the wavelength of used exposure light has been changed from g-line of a high pressure Hg lamp to i-line of a shorter wavelength. The numerical aperture (NA) of a projection lens has to be made larger to meet the requirement of a high resolution, and the depth of focus becomes smaller. As is well known, the relationship can be represented by the following equation:

$$\text{Resolution} = k_1(\lambda/NA)$$

$$\text{Depth of Focus} = \pm k_2 \lambda/NA^2$$

where $\lambda$ is the wavelength of the light source used for the exposure process, NA is the numerical aperture of the projection lens, and $k_1$ and $k_2$ are coefficients related to the process.

Recently, use of excimer (KrF or ArF) light having a wavelength shorter than g-line or i-line of conventional high pressure Hg lamps, or use of X-ray lithography or electron beam (EB) direct pattern drawing has been proposed. On the other hand, use of a phase shift mask or modification of illumination has been proposed for enhancement of resolution and depth.

As a known method of increasing the resolution of an optical microscope, there is a method (called "immersion method") in which the interspace between an objective lens and a sample is filled with a liquid of high refractive index (e.g. "Appl. Phys. Lett." 44652(1984), by D. W. Phohl, W. Denk & M. Lanz). The applicability of this method to transfer a fine circuit pattern of a semiconductor device is discussed in "Microelectronic Engineering" 9(1989), by H. Kawata, J. M. Carter, A. Yen and H. I. Smith, or in U.S. Pat. No. 5,121,256 (T. R. Corle and G. S. Kino), Jun. 9, 1992. Further, European Patent Application EP0,023,231A1 (Tabarelli, Werner W., Dr.) discloses a method in which a casing for immersion is placed on a stage movable in X, Y and Z directions and in which a wafer, a wafer chuck and a liquid are accommodated in the casing, the exposure operation being done while moving the casing.

SUMMARY OF THE INVENTION

However, use of an excimer laser, X-rays or and electron beam leads to increased cost of the structure. Use of a phase shift mask or modified illumination involves a problem of ineffectiveness, depending on a circuit pattern used.

The paper by D. W. Pohl et al discusses the effect of immersion in an exposure operation, but they do not mention to the structure as a practical semiconductor exposure apparatus. Also, aforementioned U.S. Pat. No. 5,121,256 mentions only to a method wherein an immersed lens is disposed close to the wafer surface.

According to the method disclosed in aforementioned European Patent Application 0,023,231, the weight of the moving components becomes large, and it results in decreased throughout (productivity). Although this European Patent Application further teaches connecting liquid circulation pipes to the casing for temperature control of the liquid, since the casing has to be moved, even use of a flexible material as the pipe material will adversely affect the stage positioning precision, particularly in consideration of current miniaturization of each semiconductor device.

It is accordingly an object of the present invention to provide an improved exposure apparatus at a low cost and high productivity, by which the effectiveness of a used exposure light source (such as g-line, i-line or excimer laser, for example) is assured regardless of the wavelength of the used light source.

In accordance with an aspect of the present invention, to achieve the above object, there is provided a projection exposure apparatus, comprising: illumination means for illuminating a pattern of an original; holding means for holding a substrate; a projection optical system for projecting an image of the pattern of the original onto the substrate held by the holding means, the projection optical system including a plane optical element spaced from the projection optical system and being disposed to be opposed to the surface of the substrate; and a casing effective to fill the interspace between the optical element and the substrate opposed to each other; wherein the optical element provides an upper cover of the casing.

In a preferred form, the apparatus may further comprise an alignment measuring system for detecting the positional relationship between the substrate and the image projected by the projection optical system with respect to a horizontal direction, a focus position detecting system for detecting the positional relationship between the substrate and the focus position of the projection optical system with respect to a vertical direction, and tilt means for moving and/or tilting the holding means in X, Y and/or $\theta$ direction on the basis of the detection through the alignment measuring system and the focus position detecting system so as to bring a pattern on the substrate into coincidence with the projected image. The apparatus may further comprise conveying means for loading and unloading the casing onto and from the holding means, and means for executing the filling of the interspace with the liquid, upon the holding means or at a position spaced from the holding means.

The substrate may provide a bottom of the casing, or the holding means may include a portion for directly supporting the substrate which portion is separated from the holding means, and wherein the portion provides a bottom of the casing while the remaining portion of the holding means holds the casing. In any case, the substrate is made detachable from the casing.

The casing may be arranged to provide one of a positive pressure and a negative pressure in the interspace. A portion of the casing may be made of a low thermal expansion material. A portion of the outer wall of the casing may be covered by a heat insulating material. The alignment measuring system may include a measurement reference mirror, wherein at least two adjoining faces of the outer wall of the casing may extend perpendicularly to each other, and wherein the at least two faces may extend substantially perpendicularly to the surface of the substrate whereby the reference mirror may be provided by the at least two faces.

The optical element may be made detachable from the casing. The casing may include pipe means with a valve, for injection and discharging of the liquid into and out of the closed space. The casing may have a reference mark to be used for placing the same on the holding means.

In relation to the liquid injected, the apparatus may comprise a pressure gauge for detecting the pressure of the filling liquid, pressure control means for controlling the pressure of the filling liquid, a vacuum pump for providing a negative pressure of the filling liquid, a thermometer for measuring the temperature of the filling liquid, temperature controlling means for controlling the temperature of the filling liquid, ultrasonic vibration means for vibrating the filling liquid with ultrasonics, a pump for injecting and discharging the liquid into and out of the closed space, filtering means coupled to the pump, for filtering the liquid, and attitude control means for tilting or holding the casing upright, wherein during injection of the liquid into the closed space the casing may be tilted or held upright so that the liquid is injected thereinto from below.

The injection of the liquid into the closed space and the exposure operation may be done at independent timings. The casing may be made openable and closable so as to allow loading and unloading of the substrate into and out of the inside of the casing. The holding means may include a passageway for holding the substrate through vacuum attraction, and an openable/closable shutter for preventing flow of the liquid into the passageway. Measuring means may be provided in the casing, for measuring any non-uniformness of illuminance during the exposure operation. Further, the apparatus may be provided with means for providing at least one of electric connection, pneumatic communication and vacuum communication to the casing.

In one aspect of the present invention, a portion of an objective lens constituting a projection optical system is provided on a side of a casing filled with liquid, and an original is moved together with this casing to an exposure station. Alternatively, the conveyance of such casing and conveyance of a substrate as well as the filling of liquid may be executed at the exposure station. This needs a small modification of a projection exposure apparatus currently developed as a producing machine.

With the structure described above, the present invention utilizes the effect of immersion. Here, the term "effect of immersion" means that, if $\lambda_0$ denotes the wavelength of exposure light in the air, n denotes the refractive index of liquid 23 with respect to the air, to be used for the immersion (see FIG. 10), and $\alpha$ denotes the convergence half angle of the light and if $NA_0=\sin\alpha$, the resolution and the depth of focus described hereinbefore are represented as follows:

Resolution=$k_1(\lambda_0/n)/NA_0$

Depth of Focus=$\pm k_2(\lambda_0/n)/(NA_0)^2$

Namely, the effect of immersion is equivalent to use of an exposure wavelength of 1/n. In other words, if a projection optical system of the same NA is designed, the immersion is able to enlarge the depth of focus n times. This is effective to any pattern, and it can be used in combination with the phase shift method or the modified illumination method. In order to assure this effect, it is necessary to control the purity, homogeneity or temperature of the liquid precisely. In an exposure apparatus of the type in which a wafer is sequentially exposed through step-and-repeat motion, it is important to minimize flow or vibration of the liquid during the exposure operation and to remove bubbles produced during immersion of a wafer in the liquid and remaining on the wafer surface.

In the present invention, as will be explained with reference to some embodiments, a specific arrangement is used to solve these problems. Thus, with the present invention, an immersion type exposure apparatus which assures the effect of immersion sufficiently is provided. The present invention will enable use of a conventional stepper type exposure apparatus having an excimer laser light source or a conventional (established) manufacturing process, for manufacture of DRAMs of 256 Mbit to 1 Gbit. Further, the present invention will effectively solve the problem of contamination of a wafer, and it advantageously enhances the flatness correction of a wafer.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Embodiment 1

Figure 1:
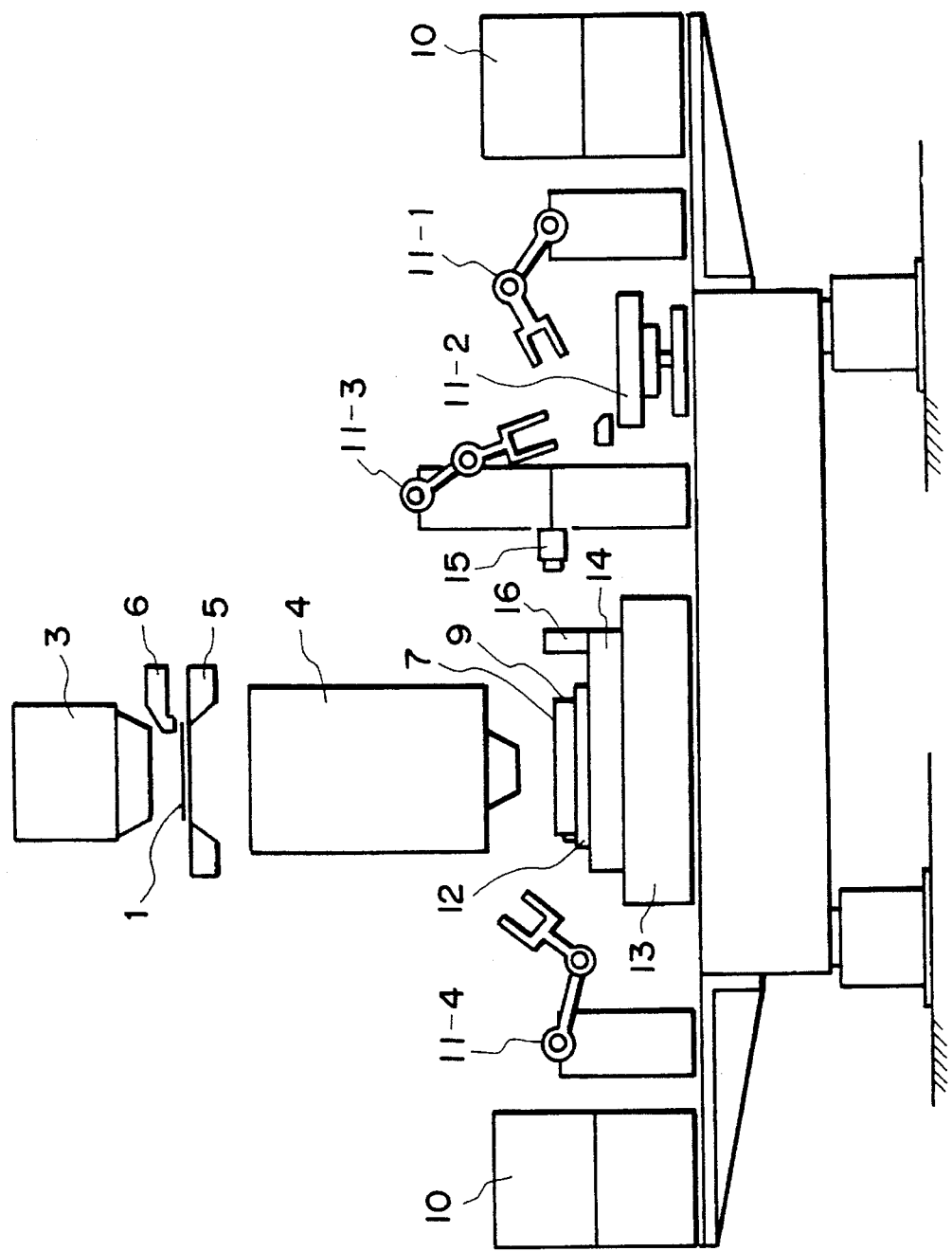
FIG. 1 is a schematic side view of an immersion type projection exposure apparatus according to a first embodiment of the present invention.

FIG. 1 is a schematic side view of an immersion type projection exposure apparatus according to a first embodiment of the present invention. In this apparatus, as illustrated, each wafer being accommodated and immersed in liquid in a cassette beforehand is conveyed for exposure of the same.

Figure 2:
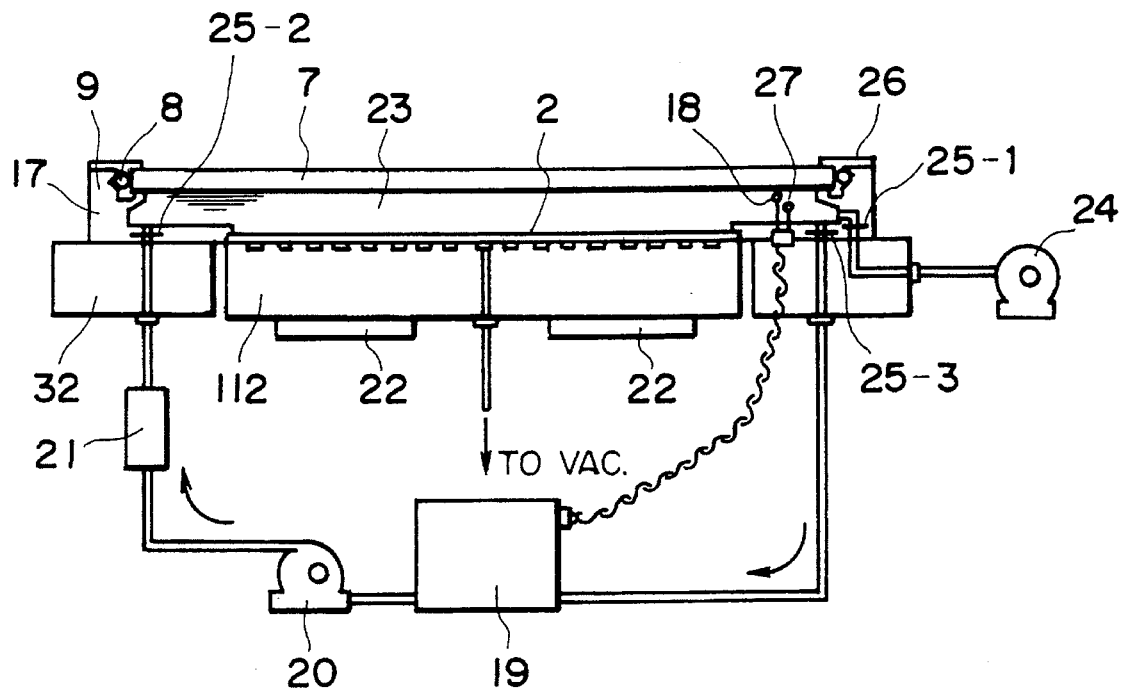
FIG. 2 is a schematic section of a cassette immersing operation device which can be incorporated into the apparatus of FIG. 1.

Denoted in the drawing at 1 is a reticle, and denoted at 3 is an illumination optical system having a shutter and a light adjusting device, etc. for projecting a circuit pattern of the reticle 1 upon a wafer having a photosensitive material coating. Denoted at 4 is a projection optical system for such pattern projection; at 5 is a reticle stage for holding and placing the reticle 1 at a predetermined position; and at 6 is an alignment optical system for providing correct alignment of an image of the reticle with a circuit pattern already printed on the wafer. Denoted at 7 is a lens of the projection optical system 4 which is disposed opposite to the surface of the wafer (hereinafter it will be called as "second optical element"). As shown in FIG. 2, the second optical element 7 comprises a parallel plane glass. This is important in respect to separating the second optical element 7 from the projection optical system 4 and to constituting a portion of a cassette 9 which is movable with a wafer stage. Also, making plane the surface of the optical element 7 opposed to the wafer 2 is important in the point of preventing an air layer or bubbles from being left at the surface of the second optical element 7 during the immersing operation. Further, the surface of the optical element 7 and the surface of the photosensitive layer of the wafer, to be immersed, may desirably be coated with a material having affinity to the liquid used for the immersion. Also, as shown in FIG. 2, a seal 8 is provided between the second optical element 7, the wafer 2 and the cassette 9 to prevent leakage of liquid 23 and to assure tightness of the cassette 9.

Denoted at 10 is a cassette stock for storing the cassette 9 therein. Denoted at 11-1 to 11-3 are (components of) a cassette conveying device and a cassette rough positioning device, for taking the cassette 9 out of the stock 10 and moving the same onto the wafer stage. More specifically, reference numeral 11-1 denotes a cassette conveying device for conveying the cassette 9 and reference numeral 11-2 denotes a cassette position rough-detection mechanism (usually called "prealignment mechanism"). Reference numeral 11-3 denotes a hand for feeding the cassette 9. Denoted at 12 is a wafer chuck for holding the wafer (mounted on the bottom of the cassette 9) together with the cassette. Denoted at 13 is an X-Y stage for positioning the wafer (in the cassette 9) at a predetermined position. Denoted at 14 is a fine-motion stage having a wafer 0-position correcting function, a wafer Z-position adjusting function and a tilt function for correcting any tilt of the wafer. Denoted at 15 is laser interferometer means for measuring the position of the stage. Denoted at 16 is a reference mirror which is mounted on the top of the fine-motion stage 14 in respect to the X direction (another, not shown, is mounted in respect to the Y direction), for reflecting light from the laser interferometer means 15.

Mounted around the cassette 9 is a heat insulating material 17 for blocking heat transfer to the outside so as to keep the temperature. The heat insulating material 17 may be omitted if the cassette 9 itself is made of a material having a heat insulating effect, such as engineering ceramics, for example. Also, the cassette 9 may be made of a low thermal expansion material such as Celodule or Superinver (tradename) and the reference mirror 16 of the laser interferometer means 15 may be mounted on the side face of it, with a result of enhanced measurement precision. Further, in that occasion, even if a foreign particle is adhered to the surface of the second optical element 7 which is mounted on the top of the cassette 9 and at a position spaced from the wafer surface, it is not easily transferred to the water surface. Thus, the problem of particle adhesion to the wafer surface or contamination of the same during the wafer conveyance, can be solved. This is very effective to the manufacture of semiconductor devices of decreasing linewidths.

For exposure operation, first a cassette 9 in which a wafer 2 having a photosensitive material is mounted and the inside of which is filled with a liquid 23, such as shown in FIG. 2, is taken out of the stock 10 by using the cassette conveying device 11-1. It is then placed on the cassette position rough detection mechanism 11-2 and, after prealignment operation, the cassette 9 is handled by the hand 11-3 and moved onto the wafer chuck 12 of the wafer stage. Then, its position is adjusted and it is held thereat by attraction. Subsequently, like the operation in an ordinary wafer exposure apparatus, the fine positioning operation to the wafer 2 (alignment operation, focusing operation, etc.) is done and, thereafter, the exposure operation is done. Here, there may occur flow motion of the liquid 23 with the step-and-repeat motion. Since however the spacing between the surfaces of the second optical element 7 and the wafer 2 is small, such as of an order of a few millimeters to several tens of millimeters and since the liquid 23 has viscosity, such motion of the liquid 23 in the cassette 9 is attenuated in a relatively shot time period. Since the outside peripheral surface of the cassette 9 is covered by a heat insulating material, a constant temperature can be maintained at least during a period of processing one wafer. Thus, no temperature control may be necessary. After the whole surface of the wafer 2 is completed, the cassette 9 placed on the wafer chuck 12 is handled by an unloading hand 11-4 and it is moved into another cassette stock 10.

Figure 3:
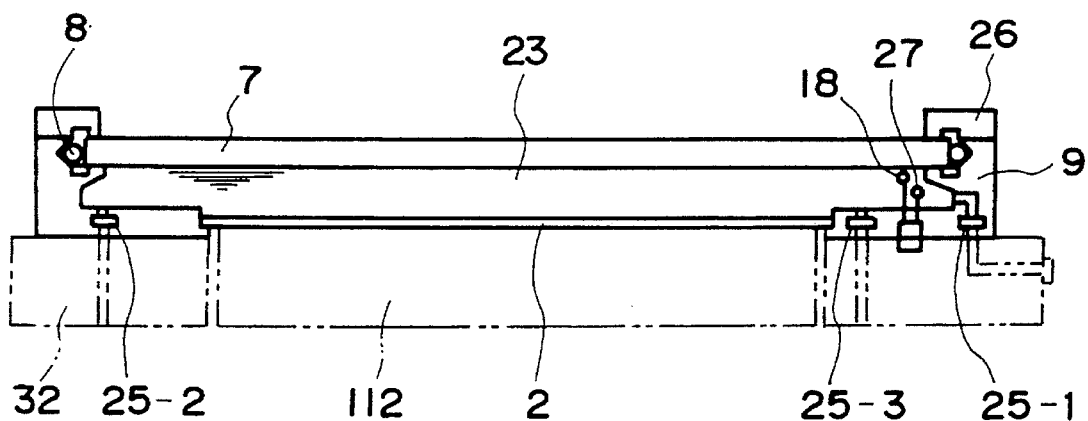
FIG. 3 is a sectional view of another type cassette usable in the apparatus of FIG. 1.

FIG. 2 is a schematic section of a cassette immersing operation device for mounting a wafer 2 in a cassette 9 while a negative pressure is provided within the cassette 9 and for filling the inside of the cassette 9 with a liquid 23. FIG. 3 is a sectional view which illustrates a case where a wafer 2 is mounted in a cassette 9 while a positive pressure is provided within the cassette. Such device may be incorporated into the projection exposure apparatus for wafer processing.

As seen in FIG. 2, the cassette immersing operation device comprise a thermometer 18 for measuring temperature of the liquid 23; a temperature controller for adjusting the liquid 23 temperature on the basis of the output of the thermometer; a circulation pump 20 for controlling the quantity of the liquid 23 and for circulating the temperature controlled liquid 23 as well as for controlling the pressure of the liquid 23; a filter 21 for filtering impurities of the liquid 23; an ultrasonic vibration device 22 which is provided to homogenize the liquid 23 and to prevent adhesion of bubbles to the surface of the wafer 2 or the second optical element 7; a vacuum pump 24 for providing a negative pressure within the cassette to remove bubbles in the liquid 23; a valve 25-1 connected to the vacuum pump 24; valves 25-2 and 25-3 connected to the piping system of the liquid 23; a fixture element 26 for fixing the second optical element 7; and a pressure gauge 27 for measuring the inside pressure of the cassette 9.

Figure 4:
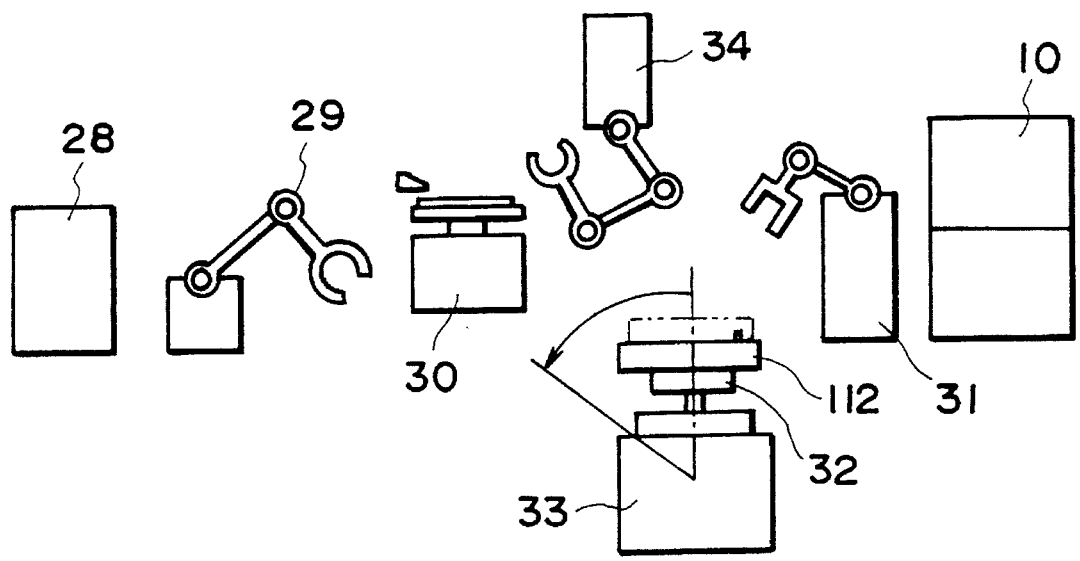
FIG. 4 is a schematic view of conveying means used in the immersing operation device of FIG. 2.

FIG. 4 is a schematic view of conveying means used in this cassette immersing operation device. In FIG. 4, denoted at 28 is a wafer stock and denoted at 29 is a wafer loading hand for taking a wafer out of the wafer stock 28 and for moving it into a wafer rough positioning device 30. Denoted at 31 is a cassette loading hand for taking a cassette 9 out of the cassette stock 10 and for moving it to a predetermined position, and denoted at 32 is a cassette station which includes a wafer chuck for fixing a wafer 2 and a cassette chuck for fixing the cassette 9 and for automatically connecting pipes and sensors to the cassette 9. Denoted at 33 is a mechanism for tilting the cassette station 32, and denoted at 34 is a wafer moving hand for moving the positioned wafer 2 onto the wafer chuck 112.

Figure 5:
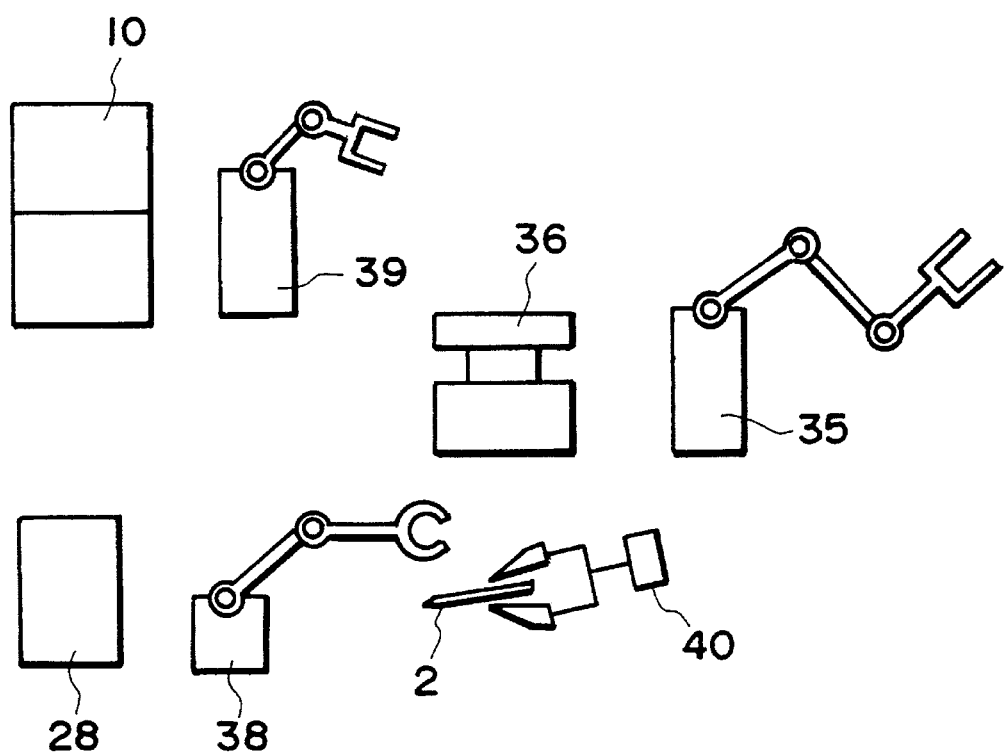
FIG. 5 is a schematic view of the structure for post-processing of a cassette, having been subjected to the exposure operation in the apparatus of FIG. 1.

FIG. 5 is a schematic view, illustrating the post-processing of the cassette 9 having been subjected to the exposure operation. Denoted in the drawing at 36 is a post-processing station having a mechanism for unloading the liquid 23 in the cassette having been subjected to the exposure operation.

Denoted at 35 is a cassette unloading hand for moving the cassette 9 to the post-processing station 36, and denoted at 38 is another hand for taking the wafer 2 out of the cassette 9 and for conveying the same to a wafer stock 28. Denoted at 39 is a hand for moving the empty cassette 9 back into the cassette stock 10.

In the immersing operation, as shown in FIG. 4, first a wafer 2 having a photosensitive material coating is taken out of the wafer stock 28 by means of a wafer loading hand 29, and it is place on a wafer rough positioning device 30 for rough positioning of the same. The thus positioned wafer 2 is moved and positioned on the wafer chuck of the cassette station 32 by means of the wafer moving hand 34. The wafer is then held thereon by vacuum attraction. Subsequently, an empty cassette is taken out of the cassette stock 10 by means of the cassette conveying hand 31, and it is placed on the wafer chuck 112 of the cassette station 32. In this state, various pipes and sensors are coupled to the wafer chuck 112 of the cassette station 32 through the wafer chuck 112, for example. By this, the wafer 2 is positioned on the bottom of the cassette 9. Thereafter, the mechanism 33 is actuated to tilt the cassette 9 or hold it upright, together with the cassette station 32. Then, the circulation pump 20 is actuated to pump the liquid 23 into the cassette 9 until a predetermined quantity of liquid is fed thereinto. Then, the pump 20 stops.

Here, there is a possibility that a small amount of air remains in the upper portion of the wafer cassette 9. In consideration thereof, the vacuum pump 24 is connected to such portion. Thus, by operating the vacuum pump 24, any air remaining in the liquid 23 can be removed. In that occasion, the ultrasonic vibration device 22 may be operated, by which small bubbles adhered to the inside wall of the cassette 9 or to the surface of the wafer 2 can be removed. This assures homogenization of the liquid 23 in a reduced time. After the remaining air in the cassette 9 is removed, a vacuum pump valve 25-1 incorporated in the cassette 9 is closed, and the circulation pump 20 is actuated again so as to fill the inside of the cassette 9 with the liquid 23. The inside pressure is decreased by a small amount while it is monitored by means of the pressure gauge 27. The amount of pressure decrease for fixation of the wafer 2 on the bottom of the cassette 9 may be sufficiently of an order of 0.99–0.80 times the atmospheric pressure. When the inside pressure becomes equal to a predetermined level, the circulation pump 20 is stopped and valves 25-2 and 25-3 provided in respective pipes of the cassette 9 are closed. In this state, the cassette station 32 is moved back to its horizontal attitude, and the cassette having its immersing operation now completed is moved back into the cassette stock 10 by means of the conveying hand 31.

The above-described operation is repeated, and the wafer 2 is set in the immersed state. When this device is incorporated into the exposure apparatus of FIG. 1, the immersed cassette 9 may be directly conveyed onto the wafer chuck 12 of the wafer stage by means of the cassette loading hand 11-3. In that case, the cassette conveying device 11-1 and the cassette position detecting mechanism 11-2 of FIG. 1 may be substituted by the cassette loading hand 31 and the cassette station 32.

For collection of a cassette having been subjected to the exposure operation, the cassette unloading hand 35 is used in place of the unloading hand 11-4 of FIG. 1. That is, the cassette is placed on the post-processing station 36 and, after the liquid 23 is removed by means of the liquid removing mechanism, the cassette 9 is opened by using the hand 38 and the wafer 2 therein is taken out of the cassette and is moved into the wafer stock 28. The empty cassette is moved back into the cassette stock 10 by the hand 39.

The arrangement of FIGS. 2–5 may be structured into an independent mechanism, separate of the exposure apparatus of FIG. 1. Also, in the described example, when the liquid 23 flows into the cassette 9, the cassette is held inclined or held upright and the liquid is discharged into the cassette from below. This is effective to avoid bubbles remaining inside the cassette. Also, for removing any bubbles in the liquid, the ultrasonic vibration device 22 and the vacuum pump 24 are used, this being effective to prevent any bubbles from remaining in the liquid/cassette. Further, it is possible that, after the wafer 2 is unloaded from the cassette 9 placed at the post processing station 36, an air-blow device 40 is used to dry the wafer 2.

Embodiment 2

Figure 6:
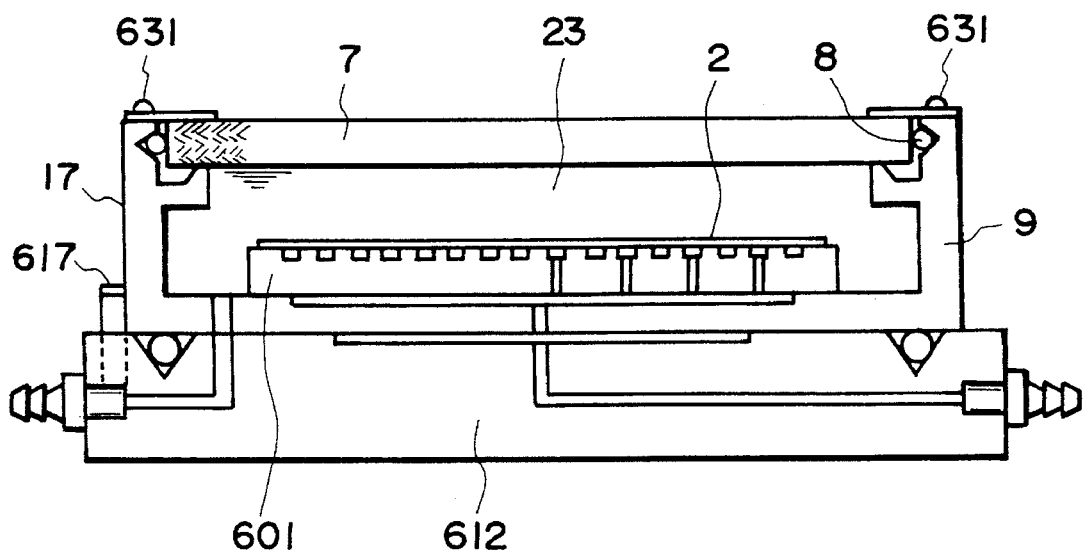
FIG. 6 is a sectional view of a cassette chucking portion of an immersion type projection exposure apparatus according to a second embodiment of the present invention.

FIG. 6 is a sectional view of a cassette chucking portion of an immersion type projection exposure apparatus according to a second embodiment of the present invention. In this apparatus, a wafer chuck 601 is provided in a cassette 9, and a cassette chuck 612 for positioning and holding the cassette 9 through vacuum attraction is disposed on a fine motion stage 14 (FIG. 1), in place of the wafer chuck 12 of FIG. 1. In this example, the cassette 9 has an opening/closing mechanism 631 for allowing loading/unloading of the wafer 2. Thus, the second optical element 7 is made detachable. Further, the cassette chuck 612 has positioning pins 617, for positioning the cassette 9, which are embedded at three locations. The remaining structure is essentially the same as that of the FIG. 1 apparatus, and the exposure operation is made similarly by using the cassette having been immersed preparatorily.

Embodiment 3

Figure 7:
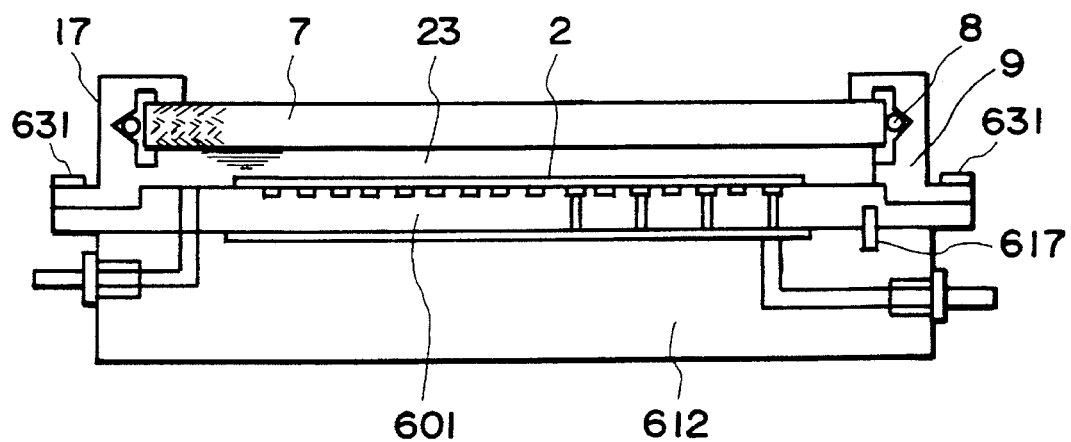
FIG. 7 is a sectional view of a cassette chucking portion of an immersion type projection exposure apparatus according to a third embodiment of the present invention.

FIG. 7 is a sectional view of a cassette chucking portion of an immersion type projection exposure apparatus according to a third embodiment of the present invention. In this apparatus, the bottom of the cassette 9 provides a wafer chuck 601, such that the wafer chuck 601 can be separated from the main portion of the cassette 9. This separability allows loading/unloading of a wafer 2. The remaining structure is essentially the same as that of the FIG. 6 apparatus.

Embodiment 4

Figure 8:
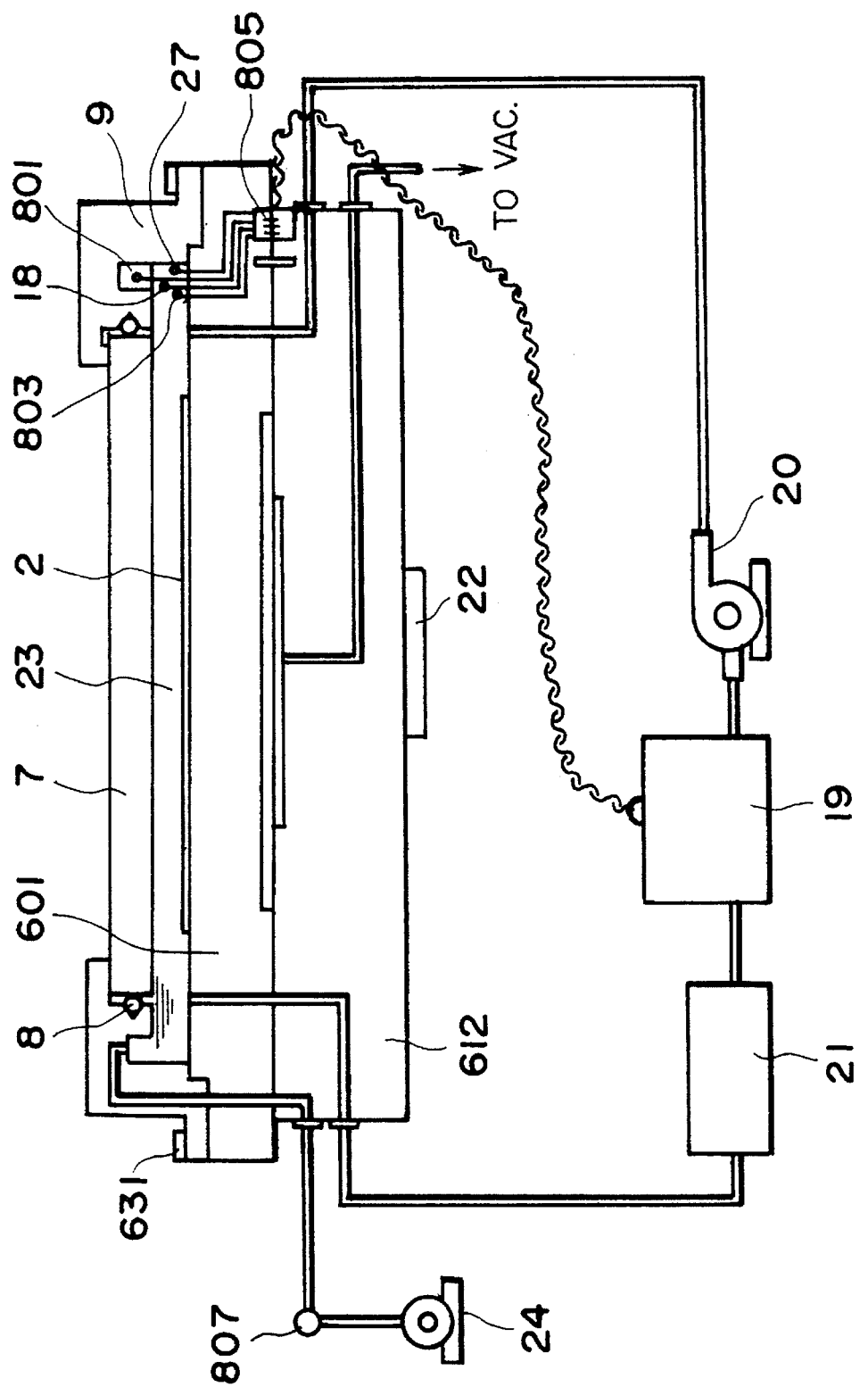
FIG. 8 is a sectional view of a cassette chucking portion of an immersion type projection exposure apparatus according to a fourth embodiment of the present invention.

FIG. 8 is a sectional view of a cassette chucking portion of an immersion type projection exposure apparatus according to a fourth embodiment of the present invention. In this apparatus, after a cassette 9 is conveyed to and held on a cassette chuck 612, the immersing operation is done. In FIG. 8, denoted at 801 is a liquid level gauge for measuring the level of liquid 23 in the cassette 9, and denoted at 803 is a measuring device for measuring the refractive index of the liquid 23. Denoted at 805 is a connector for electrically connecting the cassette 9 with the cassette chuck 612; denoted at 807 is a valve coupled to a vacuum pump 24; denoted at 601 is a wafer chuck which defines the bottom of the cassette 9 and which can be separated from the main assembly of the cassette 9; denoted at 631 is an opening/closing mechanism for separating the wafer chuck 601 for unloading/loading the wafer 2. Like numerals as of those of the preceding drawings are assigned to similar elements.

In the structure of this embodiment, the cassette 9 is conveyed onto the cassette chuck 612 in a similar manner as in the embodiment of FIG. 1, and it is positioned and held fixed through vacuum attraction. In response, the cassette 9 and the cassette chuck 612 are coupled to each other. At the same time, various sensors and pipes from a vacuum pump 24, a circulation pump 20 and so on are automatically connected to the cassette. The liquid 23 for immersion having its temperature controlled by a temperature controller 19 is pumped by the circulation pump into the cassette 9 through a filter 21. When the liquid 23 of a predetermined quantity is fed, this is detected by the liquid level gauge 801 and the pump 20 is stopped.

Subsequently, the vacuum pump 24 coupled to a portion adjacent to the top of the cassette 9 is actuated to remove bubbles in the liquid 23. Simultaneously, an ultrasonic vibration device 22 is actuated to remove bubbles in the liquid 23, bubbles adhered to the wafer 2 surface, and bubbles adhered to the surface of the second optical element 7. Such ultrasonic vibration is effective also for homogenization of the liquid 23 itself. Since the amplitude of vibration is so small and the frequency is high, it does not affect the wafer positioning or wafer exposure.

After the bubbles are removed, the vacuum pump 24 is stopped and the valve 87 is closed. Also, the pressurizing and circulating pump 20 is actuated to start pressurization of the liquid 23. When a pressure gauge 27 detects the attainment of a predetermined pressure, continuous monitoring of the temperature of the liquid 23 through a thermometer 18 starts. If the temperature shifts from a predetermined temperature, the pressurizing and circulating pump 20 is actuated again to circulate liquid 23 of a constant temperature. Here, the circulation of liquid 23 produces flow motion of the same and it disturbs the homogeneity of the liquid 23. In consideration thereof, the refractometer 803 is used measure the homogeneity of the liquid. The exposure operation is done after the homogeneity is checked.

The exposure operation is done in a similar manner as described. In order to prevent any effect of motion of the liquid 23 resulting from step-and-repeat motion, a delay time may be set after the stepwise motion for each shot. Alternatively, the state of flow motion may be measured by using the refractometer 803, and the sequence may be continued after the liquid motion stops. Further, the pressure of the liquid 23 may be used to enhance the function of the wafer chuck 601 for correcting flatness of the wafer 2.

After the exposure operation is completed, the circulation pump 20 is actuated to discharge the liquid 23 out of the cassette. Then, the shutter inside the wafer chuck 601 is closed and, after this, the cassette 9 is moved back into the stock 10. By this, the exposure process of one wafer is completed.

Embodiment 5

Figure 9:
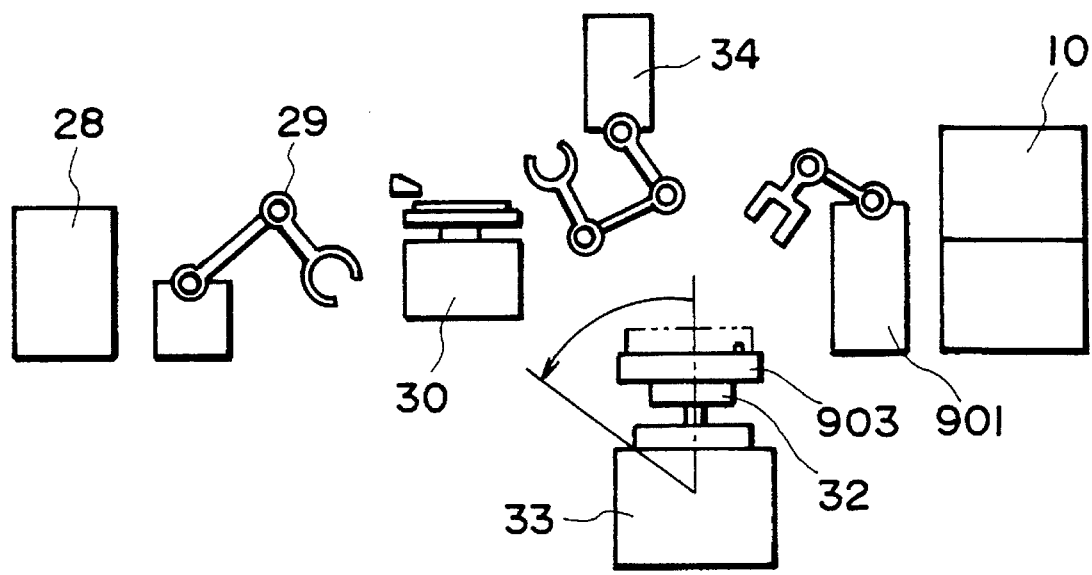
FIG. 9 is a schematic view of an arrangement for adding an immersing operation device of a fifth embodiment of the present invention, to an exposure apparatus.
Figure 10:
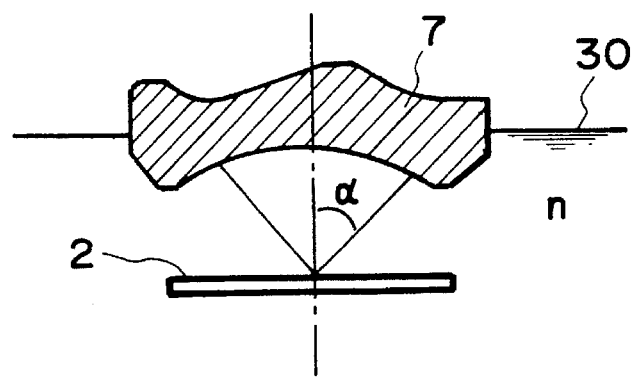
FIG. 10 is a schematic view for explaining the effect of immersion.

FIG. 9 is a schematic view of a structure which is adapted to add an immersing operation device of a fifth embodiment of the present invention to an exposure apparatus. This structure is applicable to the arrangement of FIG. 6 or 7 wherein a cassette of wafer accommodation type is used. This example differs from the FIG. 4 embodiment in the points that a cassette hand 901 having a cassette opening/closing mechanism is used in place of the cassette hand 31, that a cassette chuck 903 is used in place of the wafer chuck 112 and that the hand is arranged to move a wafer into a cassette 9 held on the cassette chuck 903.

With this arrangement, for immersion, first an empty cassette is taken out of a cassette stock 10 by means of the cassette hand 901, and it is placed on the cassette chuck 903. In this state, various pipes and sensors are connected to the cassette, as in the case of FIG. 8. Simultaneously, the cassette 9 is opened by means of the opening/closing mechanism, and a wafer 2 having a photosensitive material coating is taken out of a wafer stock 28 by means of the hand 29. The wafer is then placed on a wafer rough positioning mechanism 30, and rough positioning of the same is done. The thus positioned wafer is then placed and positioned on the wafer chuck in the cassette 9 by means of the hand 34, and it is held fixed through vacuum attraction. Subsequently, the cassette 9 is closed by the cassette hand 901 and it is locked. After this, the cassette 9 is tilted or held upright together with the cassette station 32. Thereafter, the liquid 23 is fed into the cassette 9 in a similar manner as described, and bubbles in the liquid 23 are removed. Then, the liquid is pressurized. After a predetermined pressure is attained, the circulation pump is stopped, and the valves in the pipes incorporated into the cassette are closed. Then, the cassette station 32 is moved back to its horizontal attitude, and the cassette 9 having its immersing operation completed is moved back into the cassette stock 10 by means of the cassette hand 901.

Also in this example, the device can be incorporated into the exposure apparatus of FIG. 1 in a similar manner as has been described with reference to FIG. 4. Further, the post-processing after the exposure operation may be done in a similar manner as has been described with reference to FIG. 5.

While the invention has been described with reference to the structures disclosed herein, it is not confined to the details set forth and this application is intended to cover such modifications or changes as may come within the purposes of the improvements or the scope of the following claims.

What is claimed is:

1. A projection exposure apparatus, comprising:

illumination means for illuminating a pattern of an original;

holding means for holding a substrate;

a projection system for projecting an image of the pattern of the original onto the substrate held by said holding means, said projection system including a projection optical system and a plane optical element spaced from said projection optical system and disposed opposite to the surface of the substrate; and a casing having a filled interspace formed between said optical element and the substrate, wherein said optical element provides an upper cover of said casing, and a portion of an outer wall of said casing is covered by a heat insulating material.

2. An apparatus according to claim 1, further comprising an alignment measuring system for detecting the positional relationship between the substrate and the image projected by said projection optical system with respect to a horizontal direction, a focus position detecting system for detecting the positional relationship between the substrate and the focus position of said projection optical system with respect to a vertical direction, and tilt means for moving and/or tilting said holding means in X, Y and/or θ direction on the basis of the detection through said alignment measuring system and said focus position detecting system so as to bring a pattern on the substrate into coincidence with the projected image.

3. An apparatus according to claim 2, wherein said alignment measuring system includes a measurement reference mirror, wherein at least two adjoining faces on an outer wall of said casing extend perpendicularly to each other, and wherein said at least two faces extend substantially perpendicularly to the surface of the substrate, with said reference mirror being provided by said at least two faces.

4. An apparatus according to claim 2, wherein said optical element is detachable from said casing.

5. An apparatus according to claim 2, wherein said casing is openable and closable so as to allow loading and unloading of the substrate into and out of an interior of said casing.

6. An apparatus according to claim 1, further comprising
conveying means for loading and unloading said casing onto and from said holding means.

7. An apparatus according to claim 6, further comprising means for filling the interspace in said casing with liquid when said casing is held on said holding means.

8. An apparatus according to claim 6, further comprising means for filling the interspace in said casing with liquid when said spacing is at a position spaced from said holding means.

9. An apparatus according to claim 8, wherein the injection of the liquid into the interspace and the exposure operation are done at independent timings.

10. An apparatus according to claim 6, wherein the substrate forms a bottom of said casing.

11. An apparatus according to claim 10, wherein the substrate is detachable from said casing.

12. An apparatus according to claim 1,
wherein said holding means includes a portion for directly supporting the substrate, with said portion being separated from said holding means, and wherein said portion provides a bottom for said casing while a remaining portion of said holding means holds said casing.

13. An apparatus according to claim 12, wherein said casing has a member operable as a reference in respect to the positioning on another portion of said holding means.

14. An apparatus according to claim 12, wherein said holding means includes a passageway for holding the substrate through vacuum attraction and an openable/closable shutter for preventing flow of liquid into the passageway.

15. An apparatus according to claim 1,
wherein said casing is arranged to provide one of a positive pressure and a negative pressure in the interspace.

16. An apparatus according to claim 1,
wherein a portion of said casing is made of a low thermal expansion material.

17. An apparatus according to claim 1,
wherein said casing includes pipe means with a valve for injecting and discharging a liquid into and out of the interspace.

18. An apparatus according to claim 1,
wherein said casing has a reference mark used for placing said casing on said holding means.

19. A projection exposure apparatus, comprising:
illumination means for illuminating a pattern of an original;
holding means for holding a substrate;
a projection system for projecting an image of the pattern of the original onto the substrate held by said holding means, said projection system including a projection optical system and a plane optical element spaced from said projection optical system and disposed opposite to the surface of the substrate;
a casing having a filled interspace formed between said optical element and the substrate opposed to each other, wherein said optical element provides an upper cover of said casing; and
a pressure gauge for detecting the pressure of a filling liquid disposed in the interspace.

20. An apparatus according to claim 19, further comprising
pressure control means for controlling the pressure of a filling liquid disposed in the interspace.

21. An apparatus according to claim 19, further comprising
a vacuum pump for providing a negative pressure of a filling liquid filling the interspace.

22. An apparatus according to claim 19, further comprising
a thermometer for measuring the temperature of a filling liquid filling the interspace.

23. An apparatus according to claim 19, further comprising
temperature controlling means for controlling the temperature of a filling liquid filling the interspace.

24. A projection exposure apparatus, comprising:
illumination means for illuminating a pattern of an original;
holding means for holding a substrate;
a projection system for projecting an image of the pattern of the original onto the substrate held by said holding means, said projection system including a projection optical system and a plane optical element spaced from said projection optical system and disposed opposite to the surface of the substrate;
a casing having a filled interspace between said optical element and the substrate, wherein said optical element provides an upper cover of said casing; and
ultrasonic vibration means for vibrating a filling liquid filling the interspace with ultrasonic vibrations.

25. An apparatus according to claim 24, further comprising
a pump for injecting and discharging a filling liquid into and out of the interspace.

26. An apparatus according to claim 25, further comprising filtering means coupled to said pump for filtering the liquid.

27. A projection exposure apparatus, comprising:
illumination means for illuminating a pattern of an original;
holding means for holding a substrate;
a projection system for projecting an image of the pattern of the original onto the substrate held by said holding means, said projection system including a projection optical system and a plane optical element spaced from said projection optical system and disposed opposite to the surface of the substrate;
a casing having a filled interspace formed between said optical element and the substrate, wherein said optical element provides an upper cover of said casing; and
attitude control means for tilting or holding said casing upright, wherein during injection of a filling liquid into the interspace said casing is tiled or held upright so that the liquid is injected thereinto from below.

28. A projection exposure apparatus, comprising:
illumination means for illuminating a pattern of an original;
holding means for holding a substrate;
a projection system for projecting an image of the pattern of the original onto the substrate held by said holding means, said projection system including a projection optical system and a plane optical element spaced from said projection optical system and disposed opposite to the surface of the substrate;

a casing having a filled interspace formed between said optical element and the substrate, wherein said optical element provides an upper cover of said casing; and means for measuring the refractive index of a filling material filling the interspace.

29. An apparatus according to claim 1, further comprising means for providing at least one of an electric connection, a pneumatic communication and a vacuum communication to said casing.

* * * * *

UNITED STATES PATENT AND TRADEMARK OFFICE
CERTIFICATE OF CORRECTION

PATENT NO. : 5,610,683
DATED : March 11, 1997
INVENTOR(S) : Takahashi

It is certified that error appears in the above-indentified patent and that said Letters Patent is hereby corrected as shown below:

COLUMN 1:

Line 57, "and" should read --an--.
Line 63, "to" should be deleted.
Line 66, "to" should be deleted.

COLUMN 2:

Line 4, "throughout" should read --throughput--.

COLUMN 5:

Line 35, "o-position" should read --$\theta$-position--.

COLUMN 6:

Line 13, "shot" should read --short--.

COLUMN 9:

Line 30, "used" should read --used to--.

UNITED STATES PATENT AND TRADEMARK OFFICE
CERTIFICATE OF CORRECTION

PATENT NO. : 5,610,683  
DATED : March 11, 1997  
INVENTOR(S) : Takahashi

Page 2 of 2

It is certified that error appears in the above-indentified patent and that said Letters Patent is hereby corrected as shown below:

COLUMN 10:

Line 56, "$\theta$ direction" should read --$\theta$ directions--.

COLUMN 12:

Line 55, "tiled" should read --Tilted--.

Signed and Sealed this

Twenty-first Day of October 1997

Attest:

BRUCE LEHMAN

Attesting Officer

Commissioner of Patents and Trademarks